United States Patent [19]

Sekiyama

[11] Patent Number: 5,745,426
[45] Date of Patent: Apr. 28, 1998

[54] MEMORY CARD AND CIRCUIT BOARD USED THEREFOR

[75] Inventor: Akinori Sekiyama, Kasugai, Japan

[73] Assignee: Fujitsu Limited, Kawasaki, Japan

[21] Appl. No.: 773,332

[22] Filed: Dec. 24, 1996

[30] Foreign Application Priority Data

Dec. 28, 1995 [JP] Japan ................................ 7-342757

[51] Int. Cl.$^6$ ........................................................ G11C 5/14
[52] U.S. Cl. ................................ 365/226; 365/52; 365/63
[58] Field of Search ................................ 365/51, 52, 63, 365/226; 361/736, 737

[56] References Cited

U.S. PATENT DOCUMENTS

| | | | |
|---|---|---|---|
| 5,272,664 | 12/1993 | Alexander et al. | 365/52 |
| 5,339,269 | 8/1994 | Takagi | 365/63 |
| 5,383,147 | 1/1995 | Sanemitsu | 365/52 |
| 5,572,478 | 11/1996 | Sato et al. | 365/226 |

Primary Examiner—David C. Nelms
Assistant Examiner—Son Mai
Attorney, Agent, or Firm—Nikaido, Marmelstein, Murray & Oram LLP

[57] ABSTRACT

A memory card has a printed circuit board which is connected to an interface connector, on which a memory device is to be mounted and which has a power line patterned thereon to supply a supply voltage to the memory device. A plurality of lines are directly connected to the power line on the circuit board and provided in association with the value of a supply voltage for the memory device. The individual lines consist of a plurality of lead lines having different layouts. The interface connector is connectable to the individual lines.

12 Claims, 8 Drawing Sheets

MEMORY CARD AND CIRCUIT BOARD USED THEREFOR

BACKGROUND OF THE INVENTION

1. Field of the Invention

The present invention relates to a memory card on which a memory device is mounted, and a circuit board used for this memory card.

2. Description of the Related Art

In general, memory integrated circuit devices used in desktop computers are mounted on a computer's mother board and operate on an ordinary drive voltage of 5 V. As computer drive voltage becomes lower, memory devices operating on 3.3 V have also become more popular. By way of example, memory cards having memory ICs mounted thereon are widely used on laptop-type personal computers. Generally speaking, memory cards having mounted memory ICs are designed to handle various supply voltages required by the various memory ICs mounted on the memory cards.

Figure 1:
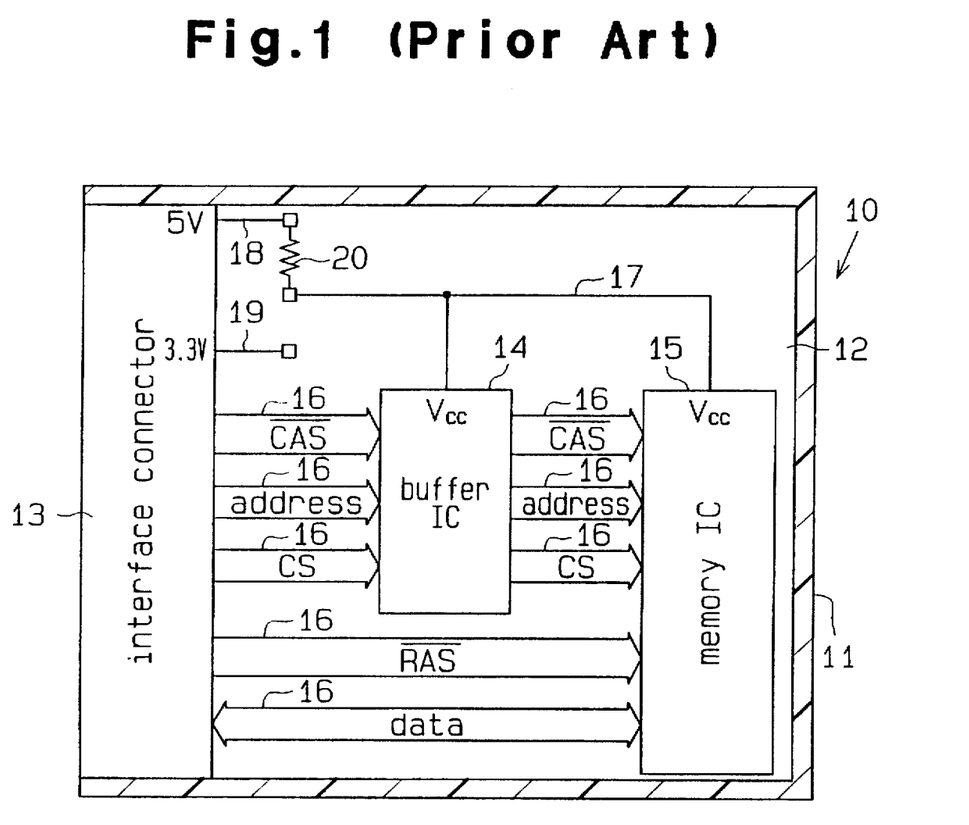
FIG. 1 is a schematic diagram showing a conventional memory card.

FIG. 1 represents a schematic illustration of a conventional memory card 10, which has a case 11, a printed circuit board 12 accommodated in the case 11 and an interface connector 13. This memory card 10 generally operates on 5 V. Therefore, a buffer IC 14 and a memory IC 15 that is mounted on the printed circuit board 12 operates on a supply voltage of 5.0 V.

A plurality of signal lines 16 are laid on the printed circuit board 12 for various kinds of signals including a column address strobe signal /CAS, a row address strobe signal /RAS, control signals CS, an address signal and a data signal. Also laid on the printed circuit board 12 is a main power line 17 for supplying a supply voltage to the buffer IC 14 and the memory IC 15.

A 5-V auxiliary line 18 for supplying the supply voltage of 5.0 V to the ICs 14 and 15 is also laid on the circuit board 12. Another auxiliary line 19 that is a 3-V line, is further laid on the circuit board 12 to supply a supply voltage to another type of memory IC that operates on 3.3 V when such memory IC is mounted on the circuit board 12.

Figure 5:
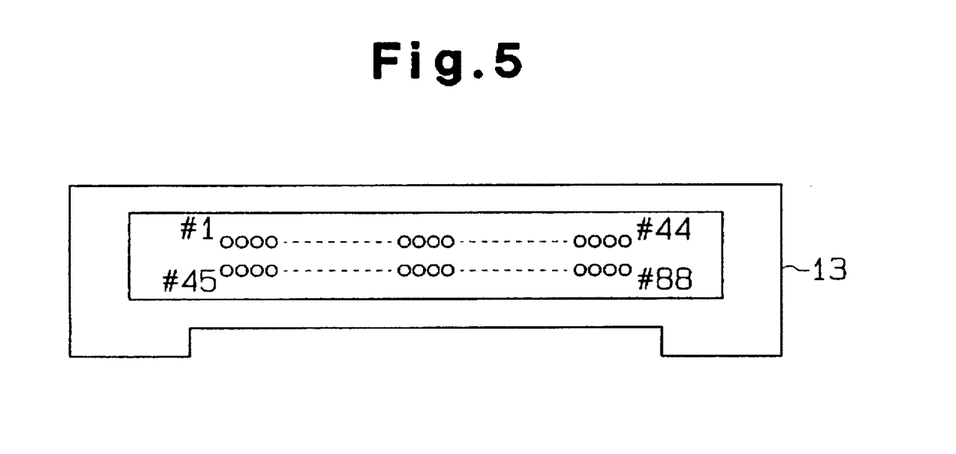
FIG. 5 is a front view of an interface connector.

The interface connector 13, that is mounted on the printed circuit board 12, is standardized to have 88 terminals. As shown in FIG. 5, the connector 13 has 44 terminals #1 to #44 aligned at the upper portion and 44 terminals #45 to #88 aligned at the lower portion. Of those 88 terminals, different power terminals are located at different positions in accordance with different values of the supply voltage in use. The 5-V power terminal is connected to the auxiliary line 18, and the 3-V power terminal is connected to the auxiliary line 19. The other terminals are respectively connected to the signal lines 16.

If memory card 10 is operable on 5 V, a jumper element 20 should be inserted between the auxiliary line 18 and the power line 17 to supply a supply voltage of 5.0 V to the power line 17. If memory card 10 is operable on 3 V, another jumper element should be inserted between the auxiliary line 19 and the power line 17 to supply the supply voltage of 3.3 V to the power line 17.

In other words, the jumper element 20 is inserted between each auxiliary line 18 or 19 and the power line 17 in the conventional memory card 10. When a large current flows through the memory card 10, therefore, the jumper element 20 serves as a resistor and unfortunately generates a large voltage drop. Consequently, the voltage on the power line 17 becomes disadvantageously unstable.

SUMMARY OF THE INVENTION

Accordingly, one embodiment of the present invention provides a memory card which can stabilize the voltage on a power line while maintaining ease of manufacture.

In another embodiment, a memory card of this invention has a printed circuit board that is connected to an interface connector, on which a memory device is mounted and which power line is patterned thereon to supply a supply voltage to the memory device. A plurality of line groups are directly connected to the power line on the circuit board and provided in association with the value of a supply voltage for the memory device. Further, the individual line groups comprise a plurality of lead lines having different layouts. The interface connector is preferably connectable to the individual line groups.

Advantageously, it is unnecessary to provide a jumper element between the power line and the interface connector. As a result, the voltage on the power line is substantially stabilized.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

A memory card according to the first embodiment of the present invention will now be described with reference to FIGS. 2 through 5. For the convenience of description, like or same reference numerals are given to those components which are the same as the corresponding components in FIG. 1 in the following description.

Figure 4:
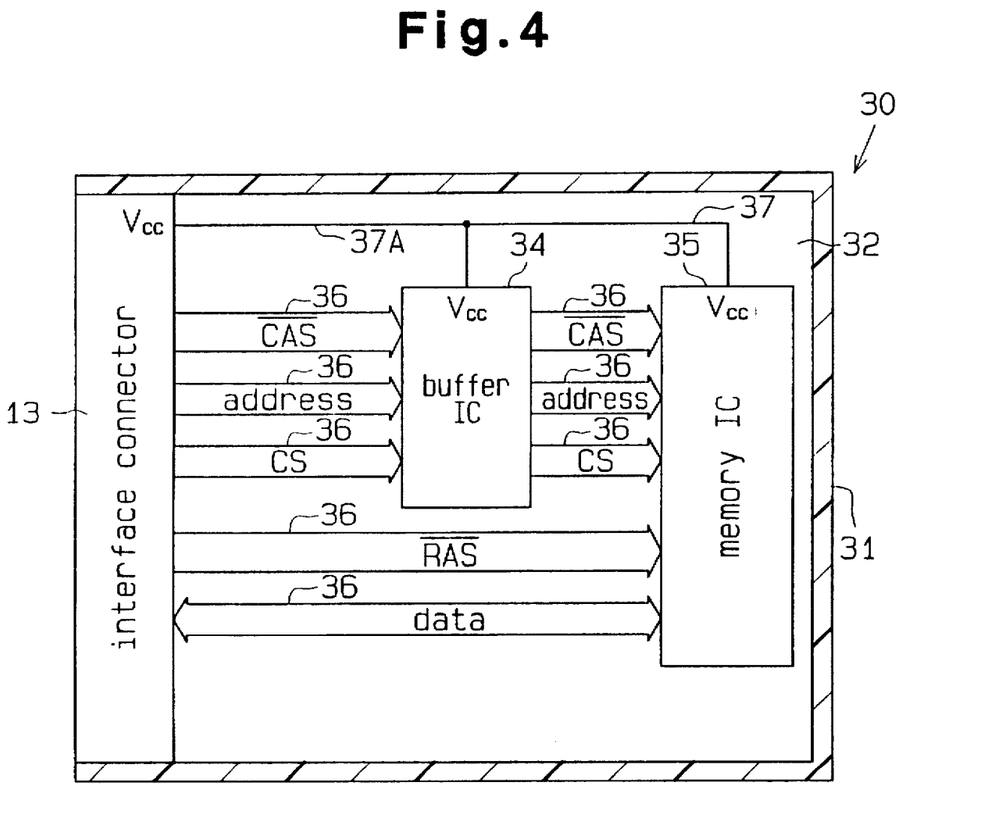
FIG. 4 is a schematic diagram of the memory card according to the first embodiment.

FIG. 4 represents a schematic diagram of a memory card 30 according to this embodiment. The memory card 30 has a case 31, a printed circuit board 32 accommodated in the case 31 and an interface connector 13. To provide the memory card 30 designed for a 5-V power supply, a buffer IC 34 and a memory IC 35, both operable on a supply voltage of 5.0 V, are mounted on the printed circuit board 32. To provide the memory card 30 designed for a 3-V power supply, alternative buffer IC 34 and memory IC 35, both operable on a supply voltage of 3.3 V this time, are mounted on the printed circuit board 32.

Figure 2:
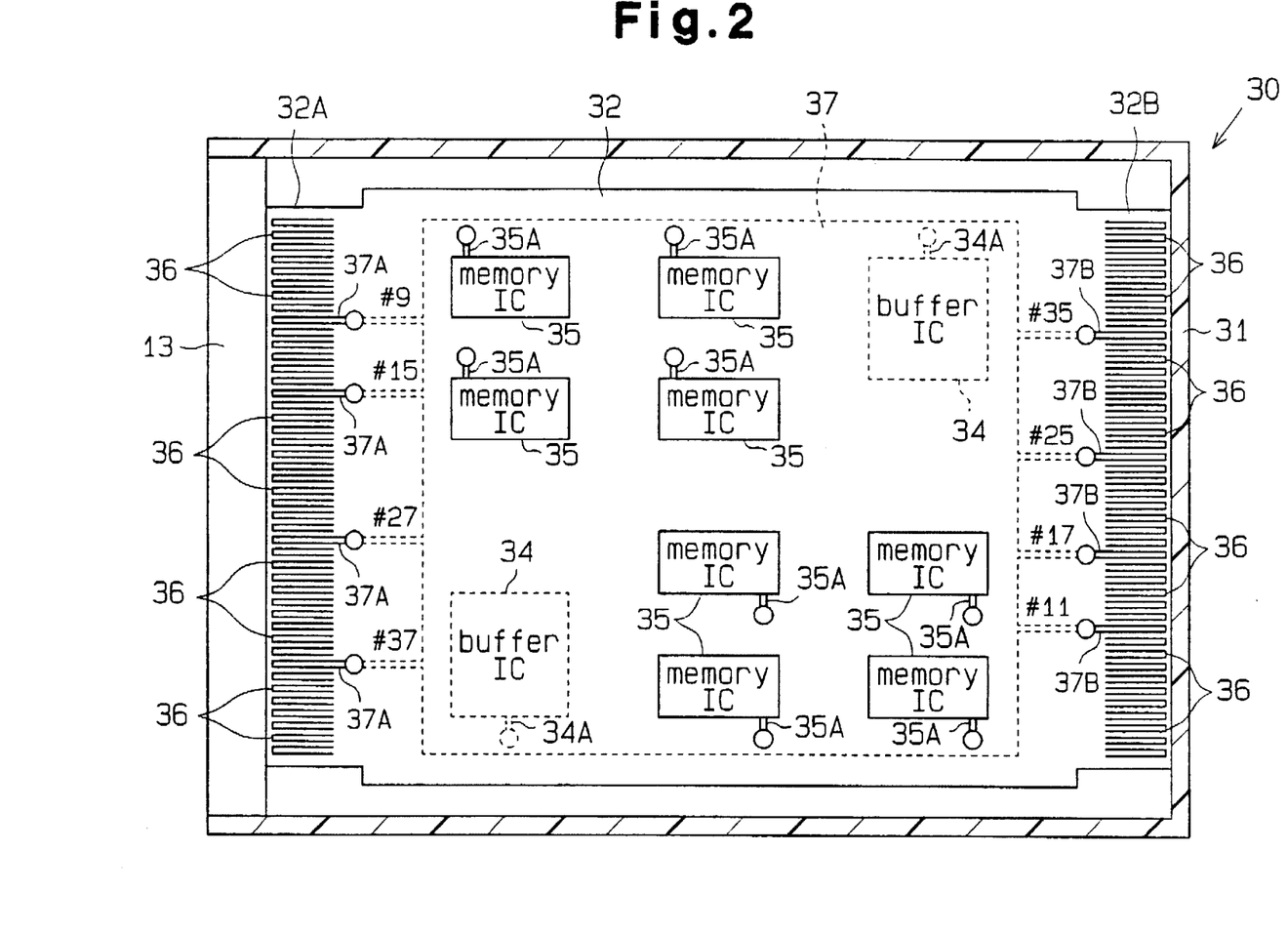
FIG. 2 is a cross-sectional view illustrating a memory card according to the first embodiment of this invention.
Figure 3:
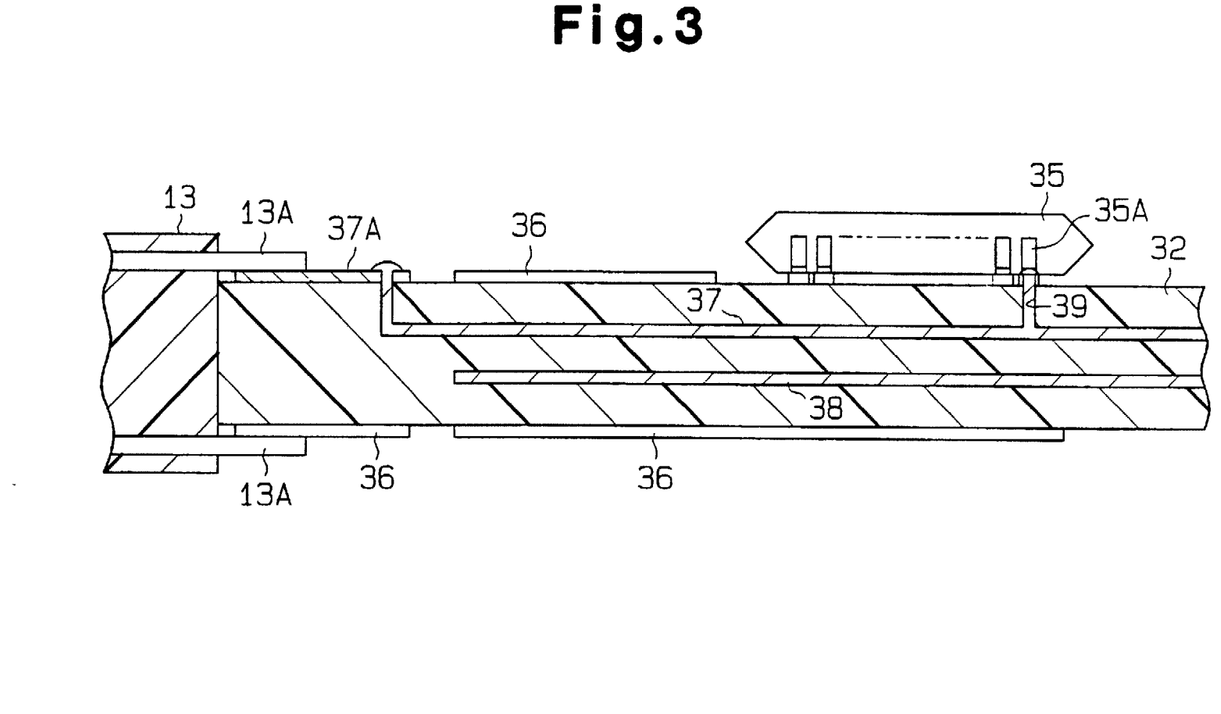
FIG. 3 is an enlarged cross-sectional view showing the essential portions of the memory card of FIG. 2.

As shown in FIGS. 2 and 3, the printed circuit board 32 in this embodiment is a multilayer board having a rectangular shape. The printed circuit board 32 has four conductive interconnection layers which are insulated from one another by insulators. A plurality of signal lines 36 are provided on the first layer at the top of the circuit board 32 and on the fourth layer at the back thereof. Provided on the second layer is a flat-shaped power line 37 which stretches nearly all over the circuit board 32. A supply voltage $V_{cc}$ is supplied via this power line 37 to both ICs 34 and 35. Provided on the third layer is another flat-shaped power line 38 of the ground potential which also stretches nearly all over the circuit board 32.

The signal lines 36 are provided for a plurality of signals including a column address strobe signal /CAS, a row address strobe signal /RAS, control signals CS, an address signal and a data signal.

The buffer IC 34 and the memory IC 35 are respectively mounted on the first layer and the fourth layer, and their power pins 34A and 35A are connected via through holes 39 to the power line 37. Note that only one memory IC 35 is illustrated in FIG. 3.

As shown in FIG. 2, the interface connector 13 is attached to a first short edge, 32A, of the circuit board 32. A second short edge 32B contacts the inner wall of the case 30. The interface connector 13 is standardized to have 88 terminals, as shown in FIG. 5. Forty four terminals #1 to #44 are aligned at the upper portion of the connector 13, and 44 terminals #45 to #88 are aligned at the lower portion. Of those 88 terminals, different power terminals are located at different positions in accordance with different values of the supply voltage in use. The terminals for the 5-V power supply are #9, #15, #27 and #37, and the terminals for the 3-V power supply are #11, #17, #25 and #35.

As shown in FIG. 2, the aforementioned signal lines 36 are laid out along the first edge 32A of the circuit board 32 in parallel with each other at predetermined pitches. Four first lead lines 37A connected to the power line 37 on the second layer are likewise laid out along the first edge 32A at predetermined intervals. As shown in FIG. 3, those lead lines 37A are connected to the 5-V power terminals 13A (#9, #15, #27 and #37) of the connector 13. The four first lead lines 37A and the associated signal lines 36 constitute a single line group.

Likewise, four second lead lines 37B connected to the power line 37 are provided along the second edge 32B of the circuit board 32. Those second lead lines 37B are laid out at predetermined intervals in association with the 3-V power terminals #11, #17, #25 and #35. The four second lead lines 37B and the associated signal lines 36 constitute another line group.

When the memory card is manufactured, therefore, by connecting the connector 13 to the first edge 32A, the individual power terminals are connected to the associated lead lines as indicated on the following Table 1. As this connector 13 is set exposed on the case 31 and the ICs 34 and 35, which are operable on 5.0 V, are mounted on the circuit board 32, the memory card 30 for the 5-V power supply is formed. A memory card for the 3-V power supply is provided by mounting ICs operable on 3.3 V on the circuit board 32, by connecting the connector 13 to the second edge 32B and then exposing this connector 13 on the case 31.

TABLE 1

| Card Type | | 5 V | 3 V |
|---|---|---|---|
| Power Terminals | #9 | 5.0 V | NC |
| | #15 | 5.0 V | NC |
| | #27 | 5.0 V | NC |

TABLE 1-continued

| Card Type | 5 V | 3 V |
|---|---|---|
| #37 | 5.0 V | NC |
| #11 | NC | 3.3 V |
| #17 | NC | 3.3 V |
| #25 | NC | 3.3 V |
| #35 | NC | 3.3 V |

In this Table 1, NC indicates the non-connected state.

This embodiment has the following advantages.

(1) Provided along the first and second edges 32A and 32B of the circuit board 32 are the lead lines 37A and 37B whose layouts vary in association with different values of a supply voltage for the buffer IC 34 and the memory IC 35 to be mounted on the circuit board 32. Two memory cards 30 which respectively operate on two levels of supply voltages can easily be manufactured by selectively connecting the connector to either the edge 32A or the edge 32B in accordance with the level of the supply voltage for the ICs 34 and 35 to be mounted on the circuit board 32.

(2) Since the lead lines 37A and 37B on the circuit board 32 are formed integral with the power line 37, there are no resistor components in the lead lines 37A and 37B and the power line 37. Even when a large current flows through the memory card 30, therefore, voltage drops do not occur on the lead lines 37A and 37B and the power line 37. This can stabilize the voltage on the power line 37.

The second embodiment of this invention will now be described referring to FIGS. 6 and 7. For the convenience of description and to avoid the redundant description, like or same reference numerals are given to those components which are the same as the corresponding components of the structure illustrated in FIGS. 2 and 4.

Figure 6:
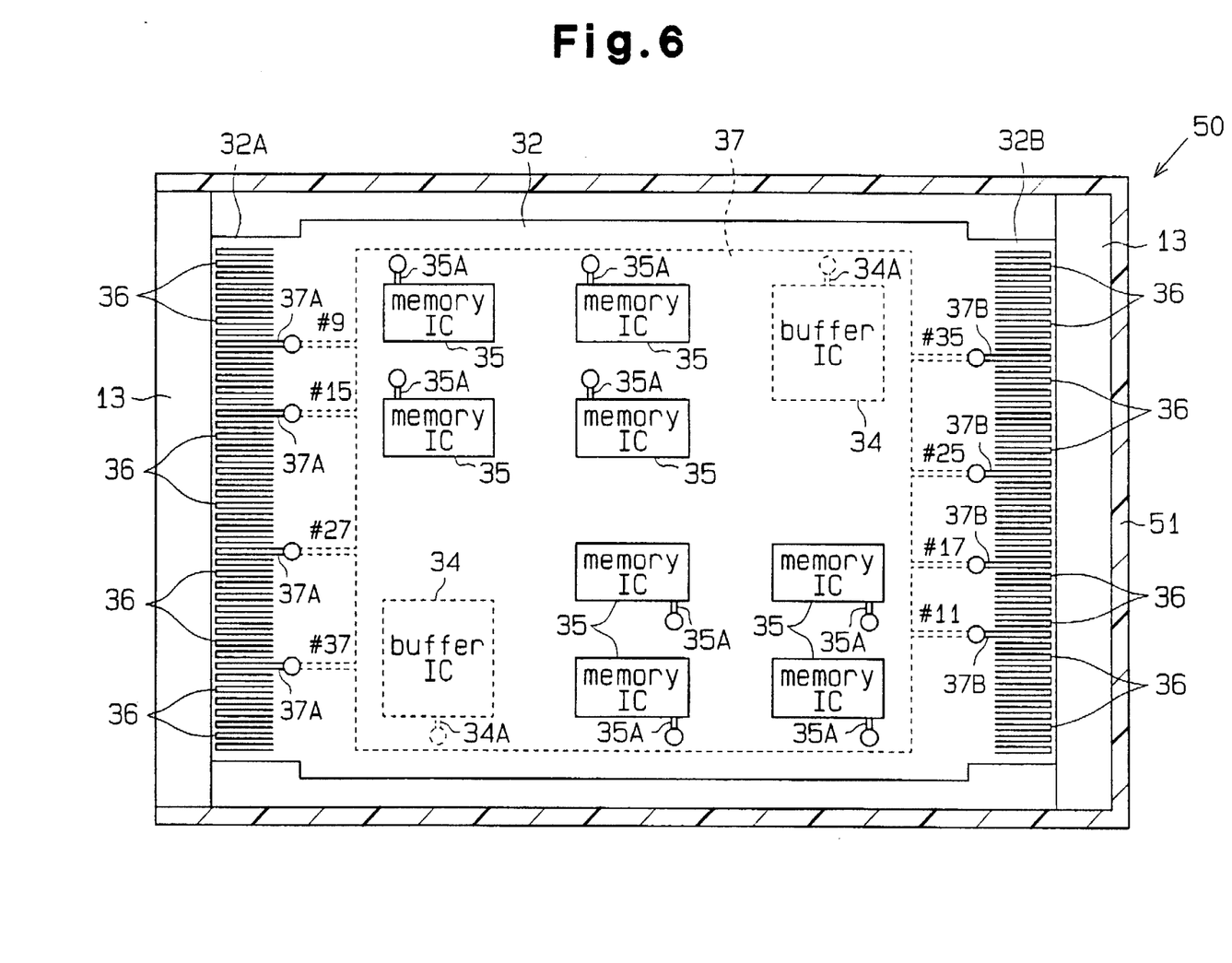
FIG. 6 is a cross-sectional view illustrating a memory card according to the second embodiment of this invention.
Figure 7:
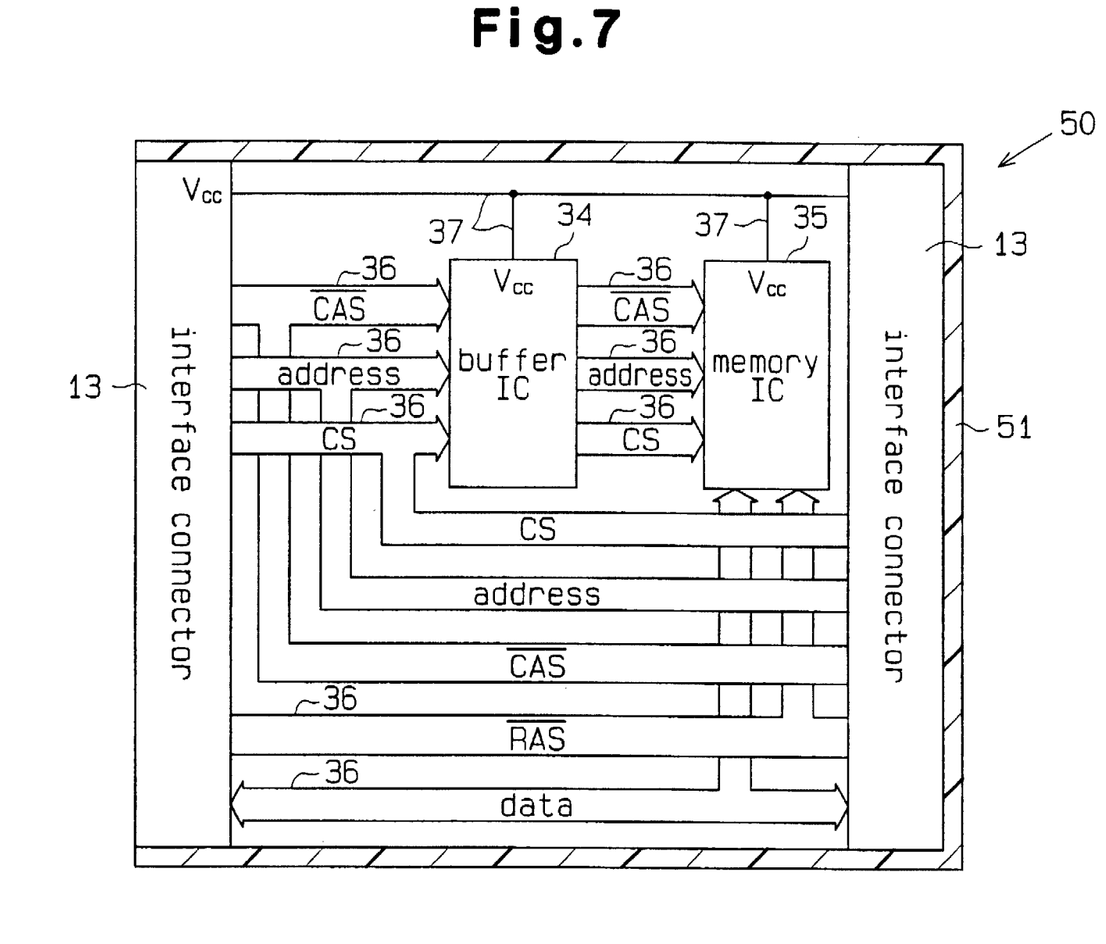
FIG. 7 is a schematic diagram of the memory card of FIG. 6.

FIG. 6 represents a schematic diagram of a memory card 50 according to this embodiment. This memory card 50 differs from the memory card 30 in that interface connectors 13 are attached to the first and second edges 32A and 32B of the printed circuit board 32. Note that the interface connector 13 to the second edge 32B is accommodated in a case 51 and cannot be seen from outside.

The two interface connectors 13 corresponding to the first and second edges 32A and 32B are connected to the associated line groups at the edges 32A and 32B before the buffer IC 34 and the memory IC 35 are mounted on the circuit board 32.

Accordingly, in addition to the advantages of the memory card 30 of the first embodiment, the memory card 50 of the second embodiment is advantageous in that memory cards operable on two different supply voltages can easily be manufactured by selectively mounting and connecting the buffer IC 34 and the memory IC 35 to the printed circuit board 32 based on the supply voltage.

The third embodiment of this invention will now be described referring to FIG. 8. For the convenience of description and to avoid the redundant description, like or same reference numerals are given to those components which are the same as the corresponding components of the structure illustrated in FIG. 2.

A memory card 52 of this embodiment has a case 53, a printed circuit board 40 accommodated in the case 53 and an interface connector 13. To provide the memory card 52 designed for a 5-V power supply, a buffer IC 34 and a memory IC 35, both operable on the supply voltage of 5 V, are mounted on the printed circuit board 40. To provide the memory card 52 operable on 3.3 V or any other suitable supply voltage. ICs are mounted on the printed circuit board 40.

The printed circuit board 40 in this embodiment has a square shape and, like the printed circuit board 32 in FIG. 2, is a multilayer board having four conductive interconnection layers. Provided on the second layer of the printed circuit board 40 is a flat-shaped power line 41 which stretches nearly all over the circuit board 40. This power line 41 is used to supply the supply voltage to the ICs 34 and 35.

The buffer IC 34 and the memory IC 35 are respectively mounted on the first layer and the fourth layer, with their power pins 34A and 35A connected through via holes (not shown) to the power line 41.

The interface connector 13 is attached to the first short edge, 40A, of the circuit board 40. This interface connector 13 is also standardized to have 88 terminals of which different power terminals are located at different positions in accordance with different rated values of a supply voltage in use. Specifically, the terminals for the 5-V power supply are #9 and #27, and the terminals for the 3-V power supply are #11 and #25. There are two other pairs of power terminals, namely the terminals #15 and #37 and the terminals #17 and #35, for two other levels of supply voltages than 3 V and 5 V (i.e., X volts and Y volts: X and Y are values other than "3.3" and "5.0").

The aforementioned signal lines 36 are laid out along the four edges 40A, 40B, 40C and 40D of the circuit board 40. Two first lead lines 41A connected to the power line 41 are laid out along the first edge 40A in association with the 5-V power terminals #9 and #27 of the connector 13. The two first lead lines 41A and the signal lines 36 along the first edge 40A constitute a line group.

Two second lead lines 41B connected to the power line to 41 are laid out along the second edge 40B in association with the 3-V power terminals #11 and #25 of the connector 13. The two second lead lines 41B and the signal lines 36 along the second edge 40B constitute another line group.

Two third lead lines 41C connected to the power line 41 are laid out along the third edge 40C in association with the X-volt power terminals #15 and #37 of the connector 13. The two third lead lines 41C and the signal lines 36 along the third edge 40C constitute another line group.

Two fourth lead lines 41D connected to the power line 41 are laid out along the fourth edge 40D in association with the Y-volt power terminals #17 and #35 of the connector 13. The two fourth lead lines 41D and the signal lines 36 along the fourth edge 40D constitute another line group.

When the memory card is manufactured, therefore, by connecting the connector 13 to the first edge 40A, the individual power terminals are connected to the associated lead lines as indicated in Table 2 given below. As this connector 13 is set exposed on the case 53, the memory card for the 5-V power supply can be formed. Likewise, the memory card for the 3-V power supply can be provided by connecting the connector 13 to the second edge 40B and exposing the connector 13 on the case 53. Further, the memory card for the X-volt power supply can be provided by connecting the connector 13 to the third edge 40C and exposing the connector 13 on the case 53. Furthermore, the memory card for the Y-volt power supply can be provided by connecting the connector 13 to the fourth edge 40D and exposing the connector 13 on the case 53.

TABLE 2

| Card Type | | 5 V | 3 V | X V | Y V |
|---|---|---|---|---|---|
| Power | #9 | 5.0 V | NC | NC | NC |
| Termi- | #15 | NC | NC | X.X V | NC |
| nals | #27 | 5.0 V | NC | NC | NC |
| | #37 | NC | NC | X.X V | NC |
| | #11 | NC | 3.3 V | NC | NC |
| | #17 | NC | NC | NC | Y.Y V |
| | #25 | NC | 3.3 V | NC | NC |
| | #35 | NC | NC | NC V | Y.Y V |

In this Table 2, NC indicates the non-connected state.

This embodiment has the following advantages.

(1) The lead lines 41A, 41B, 41C and 41D whose layouts vary in association with different values of the supply voltage for the buffer IC 34 and the memory IC 35 provided along the individual edges 40A, 40B, 40C and 40D of the circuit board 40. Therefore, the memory card 52 which operates on the desired supply voltage can easily be manufactured by selecting one of the four edges 40A to 40D in accordance with the supply voltage for the ICs 34 and 35 on the circuit board 40 and then connecting the interface connector 13 to the selected edge.

(2) As the lead lines 41A–41D on the circuit board 40 are formed integral with the power line 41, there are no resistor components in the lead lines 41A–41D and the power line 41. Even when a large current flows through the memory card 52, therefore, voltage drops do not occur on the lead lines 41A–41D and the power line 41. Accordingly, the voltage on the power line 37 remains stable.

The fourth embodiment of this invention will now be discussed referring to FIG. 9. For the convenience of description and to avoid the redundant description, like or same reference numerals are given to those components which are the same as the corresponding components of the structure illustrated in FIG. 8.

A memory card 55 according to this embodiment differs from the memory card 52 in that interface connectors 13 are attached to the individual edges 40A to 40D of the printed circuit board 40. Note that the interface connectors 13 to the second, third and fourth edges 40B, 40C and 40D are accommodated in a case 56 and cannot be seen from outside. The interface connectors 13 to the individual edges 40A–40D are connected to the associated line groups at the edges 40A–40D before the buffer IC 34 and the memory IC 35 are mounted on the circuit board 40.

Figure 8:
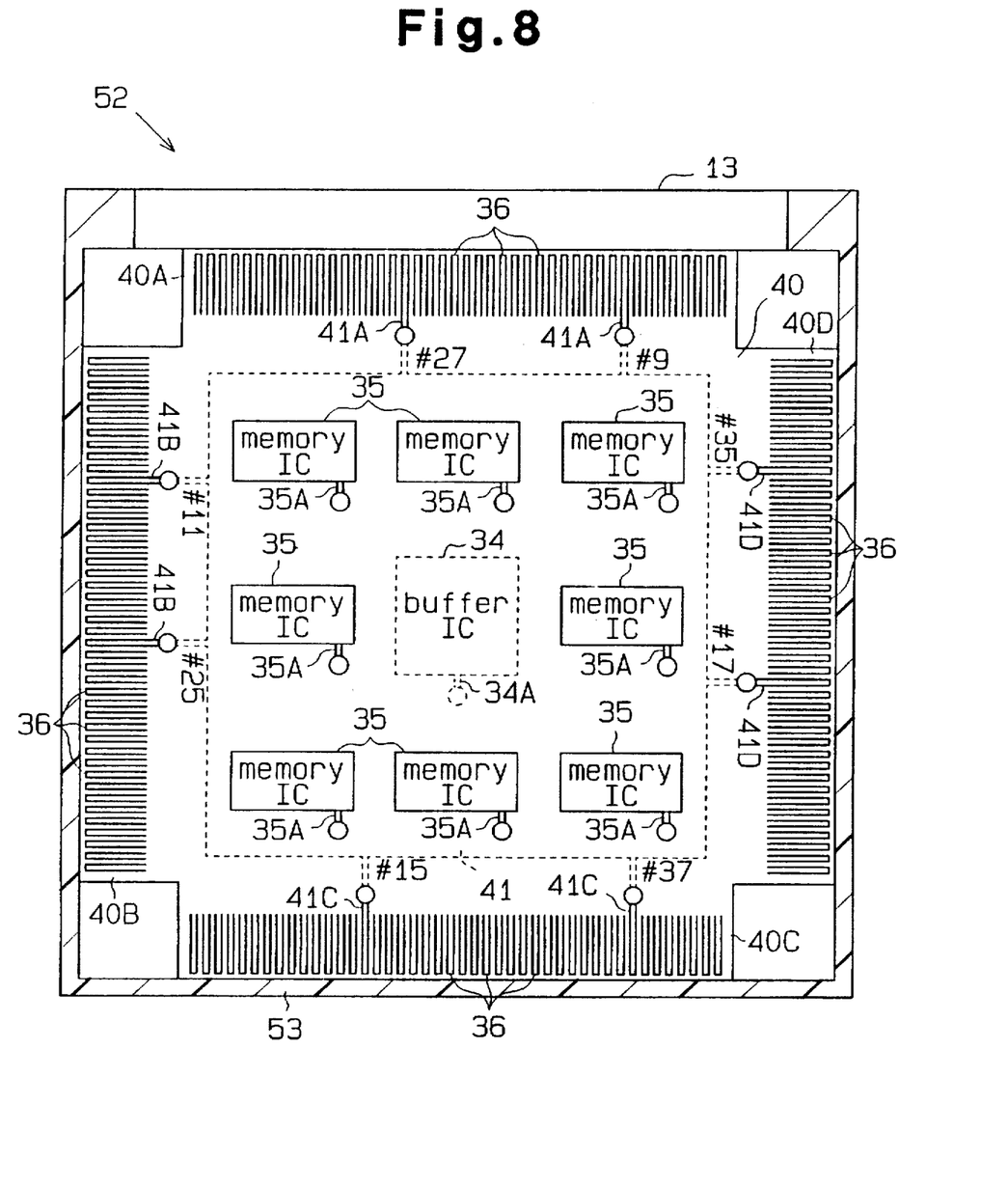
FIG. 8 is a cross-sectional view illustrating a memory card according to the third embodiment of this invention.
Figure 9:
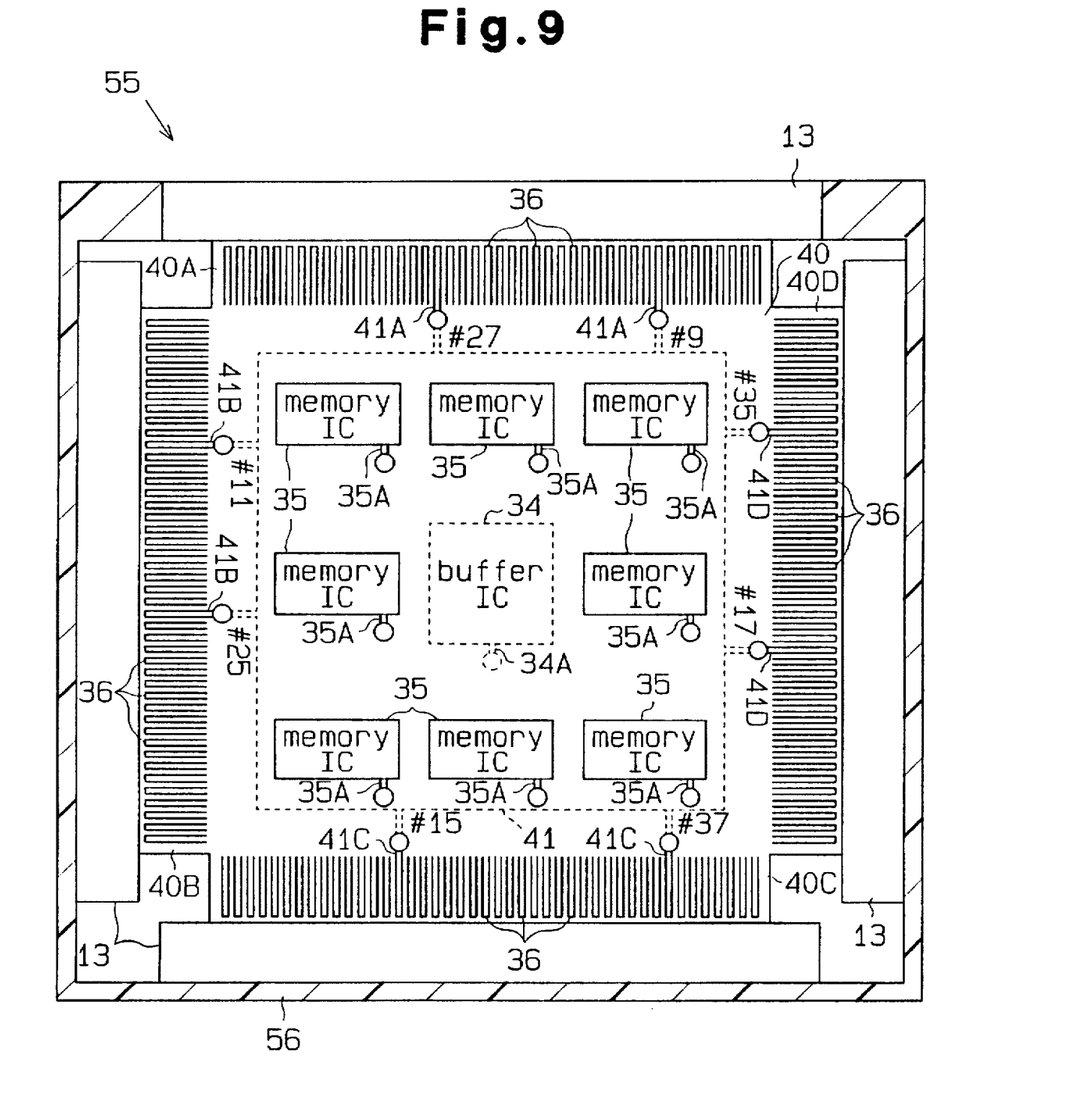
FIG. 9 is a plan cross-sectional view of a memory card according to the fourth embodiment of this invention.

Accordingly, in addition to the advantages of the memory card 52 of FIG. 8, the memory card 55 of this embodiment has such an advantage that memory cards operable on different supply voltages can easily be manufactured by merely mounting the buffer IC 34 and the memory IC 35 based on the supply voltage that will be used on the printed circuit board 40.

Although only four embodiments of the present invention have been described herein, it should be apparent to those skilled in the art that the present invention may be embodied in many other specific forms without departing from the spirit or scope of the invention. Particularly, it should be understood that the planar shapes of the circuit boards 32 and 40 are not limited to rectangular shapes but may take any other suitable shape. By way of example, suitable shapes may include triangular or pentagonal shapes.

Therefore, the present examples and embodiments are to be considered as illustrative and not restrictive and the invention is not to be limited to the details given herein, but may be modified within the scope of the appended claims.

What is claimed is:

1. A memory card having a printed circuit board connected to an interface connector, said circuit board having a rectangular shape and a plurality of edges, a memory device mounted on the printed circuit board and a power line patterned on the printed circuit board to supply a supply voltage to the memory device, said memory card comprising:

a case accommodating said circuit board:

a plurality of line groups disposed on the edges of the circuit board and provided in association with a value of the supply voltage for the memory device, said plurality of line groups including a plurality of lead lines having different layouts, wherein at least one of said plurality of lead lines is directly connected to the power line on the circuit board, wherein when the interface connector selectively connects to the plurality of line groups according to the value of the supply voltage, the interface connector is exposed from the case.

2. The memory card according to claim 1, wherein the interface connector is respectively connected to the individual line groups.

3. The memory card according to claim 1, wherein the printed circuit board is a multilayer board having a plurality of conductive interconnection layers, the conductive interconnection layers being respectively assigned to a power side and a ground side of the power line and the line groups.

4. The memory card according to claim 3, wherein the printed circuit board has four interconnection layers including first, second, third and fourth layers, the first layer being located on the front surface of the board, the second layer being located on the rear surface of the board, the third layer and the fourth layer being located inside the board, each interconnection layer being isolated by an insulating material, and wherein the power side of the power line is assigned to the second layer, the line groups are assigned to the first and fourth layers, and the ground side of the power line is assigned to the third layer.

5. The memory card according to claim 4, wherein the power side and the ground side of the power line are formed in a flat shape that substantially covers the board.

6. The memory card according to claim 1, wherein the value of the supply voltage for the memory device is one of 5.0 volts and 3.3 volts.

7. A printed circuit board for use in a memory card having an interface connector connected to the printed circuit board, said circuit board having a rectangular shape and a plurality of edges, a memory device mounted on the printed circuit board and a power line patterned on the printed circuit board to supply a supply voltage to the memory device, said memory card comprising:

a case accommodating said circuit board:

a plurality of line groups disposed on the edges of the circuit board and provided in association with the value of the supply voltage for the memory device, said plurality of line groups including a plurality of lead lines having different layouts wherein at least one of said plurality of lead lines is directly connected to the power line on the circuit board, wherein when the interface connector selectively connects to the plurality of line groups according to the value of the supply voltage, the interface connector is exposed from the case.

8. The printed circuit board according to claim 7, wherein the interface connector is respectively connected to the individual line groups.

9. The printed circuit board according to claim 7, wherein the printed circuit board is a multilayer board having a plurality of conductive interconnection layers, the conductive interconnection layers being respectively assigned to a power side and a ground side of the power line and the line groups.

10. The printed circuit board according to claim 9, wherein the printed circuit board has four interconnection layers including first, second, third and fourth layers, the first layer being located on the front surface of the board, the second layer being located on the rear surface of the board, the third layer and the fourth layer being located inside the board, each interconnection layer being isolated by insulators, and wherein the power side of the power line is assigned to the second layer, the line groups are assigned to the first and fourth layers, and the ground side of the power line is assigned to the third layer.

11. The printed circuit board according to claim 10, wherein the power side and the ground side of the power line have a flat shape that substantially covers the board.

12. A memory card having a printed circuit board, said circuit board having a rectangular shape and in plurality of edges, a memory device mounted on the printed circuit board and a power line patterned on the printed circuit board to supply a supply voltage to the memory device; said memory, card comprising:

a case accommodating said circuit board;

a plurality of line groups disposed on the edges of the circuit board, each of the line groups corresponding to a value of the supply voltage for the memory device wherein said plurality of line groups comprises a plurality of lead lines having different layouts, wherein at least one of said plurality of lead lines is directly connected to the power line on the circuit board, wherein when the interface connector selectively connects to one of the plurality of line groups according to the value of the supply voltage, the interface connector is exposed from the case.

* * * * *